United States Patent
Yu et al.

(10) Patent No.: US 9,728,414 B2
(45) Date of Patent: Aug. 8, 2017

(54) METHOD OF DEPOSITING COPPER USING PHYSICAL VAPOR DEPOSITION

(71) Applicant: SPANSION LLC, Sunnyvale, CA (US)

(72) Inventors: Wen Yu, Fremont, CA (US); Stephen B. Robie, Cupertino, CA (US); Jeremias D. Romero, Hayward, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/313,751

(22) Filed: Jun. 24, 2014

(65) Prior Publication Data

US 2014/0377948 A1     Dec. 25, 2014

Related U.S. Application Data

(62) Division of application No. 11/641,647, filed on Dec. 19, 2006, now Pat. No. 8,791,018.

(51) Int. Cl.
| | |
|---|---|
| *H01L 21/28* | (2006.01) |
| *H01L 21/285* | (2006.01) |
| *H01L 23/532* | (2006.01) |
| *H01L 21/768* | (2006.01) |

(52) U.S. Cl.
CPC .... *H01L 21/28556* (2013.01); *H01L 21/2855* (2013.01); *H01L 23/53228* (2013.01); *H01L 23/53238* (2013.01); *H01L 21/76841* (2013.01); *H01L 2924/0002* (2013.01)

(58) Field of Classification Search
CPC .......... H01L 21/2855; H01L 21/28556; H01L 21/76841; H01L 23/53228; H01L 23/53238; H01L 2924/00; H01L 2924/0002

USPC ......................................................... 438/687
See application file for complete search history.

(56) References Cited

U.S. PATENT DOCUMENTS

| | | |
|---|---|---|
| 4,511,601 A | 4/1985 | Aske et al. |
| 5,057,201 A | 10/1991 | Fujita et al. |
| 5,240,559 A | 8/1993 | Ishida |
| 5,288,456 A | 2/1994 | Aboelfotoh et al. |
| 5,654,232 A | 8/1997 | Gardner |
| 5,728,629 A | 3/1998 | Mizuno et al. |
| 5,792,522 A | 8/1998 | Jin et al. |
| 5,891,802 A | 4/1999 | Tao et al. |

(Continued)

FOREIGN PATENT DOCUMENTS

| | | | |
|---|---|---|---|
| EP | 2 154 717 A2 * | 2/2010 | ........... H01L 21/768 |
| EP | 2154717 A2 | 2/2010 | |
| JP | 06157175 | 6/1994 | |

OTHER PUBLICATIONS

USPTO Final Rejection for U.S. Appl. No. 11/641,647 dated Jan. 23, 2014; 8 pages.

(Continued)

*Primary Examiner* — Mary Wilczewski
(74) *Attorney, Agent, or Firm* — Lowenstein Sandler LLP

(57) ABSTRACT

The present method of forming an electronic structure includes providing a tantalum base layer and depositing a layer of copper on the tantalum layer, the deposition being undertaken by physical vapor deposition with the temperature of the base layer at 50.degree. C. or less, with the deposition taking place at a power level of 300 W or less.

14 Claims, 6 Drawing Sheets

(56) References Cited

U.S. PATENT DOCUMENTS

| | | | |
|---|---|---|---|
| 5,913,144 A | 6/1999 | Nguyen et al. | |
| 5,953,634 A | 9/1999 | Kajita et al. | |
| 5,980,720 A | 11/1999 | Park et al. | |
| 6,037,257 A | 3/2000 | Chiang et al. | |
| 6,037,258 A | 3/2000 | Liu et al. | |
| 6,043,153 A | 3/2000 | Nogami et al. | |
| 6,069,068 A | 5/2000 | Rathore et al. | |
| 6,077,780 A * | 6/2000 | Dubin | H01L 21/76834 257/E21.584 |
| 6,139,701 A | 10/2000 | Pavate et al. | |
| 6,143,650 A * | 11/2000 | Pramanick | H01L 21/76843 257/E21.584 |
| 6,160,315 A | 12/2000 | Chiang et al. | |
| 6,174,793 B1 | 1/2001 | Tsai et al. | |
| 6,174,811 B1 | 1/2001 | Ding et al. | |
| 6,210,541 B1 * | 4/2001 | Cooney, III | C23C 14/046 118/725 |
| 6,232,230 B1 * | 5/2001 | Iacoponi | H01L 21/7681 257/E21.579 |
| 6,251,759 B1 * | 6/2001 | Guo | H01L 21/67167 438/584 |
| 6,281,116 B1 | 8/2001 | Yanagida | |
| 6,309,970 B1 | 10/2001 | Ito et al. | |
| 6,331,484 B1 | 12/2001 | Bhowmik et al. | |
| 6,342,448 B1 * | 1/2002 | Lin | H01L 21/28568 257/E21.168 |
| 6,350,688 B1 | 2/2002 | Liu et al. | |
| 6,391,774 B1 | 5/2002 | Takewaki | |
| 6,420,258 B1 | 7/2002 | Chen et al. | |
| 6,432,819 B1 | 8/2002 | Pavate et al. | |
| 6,440,854 B1 * | 8/2002 | Rozbicki | 438/687 |
| 6,468,908 B1 | 10/2002 | Chen et al. | |
| 6,541,374 B1 * | 4/2003 | de Felipe | H01L 21/28556 257/E21.17 |
| 6,554,914 B1 * | 4/2003 | Rozbicki | C23C 8/02 148/238 |
| 6,562,715 B1 * | 5/2003 | Chen | C23C 16/34 204/192.17 |
| 6,566,246 B1 * | 5/2003 | de Felipe | H01L 21/2855 257/E21.169 |
| 6,566,259 B1 | 5/2003 | Ding et al. | |
| 6,573,607 B2 | 6/2003 | Ito et al. | |
| 6,582,569 B1 | 6/2003 | Chiang et al. | |
| 6,607,640 B2 * | 8/2003 | Sundarrajan et al. | 204/192.15 |
| 6,607,977 B1 * | 8/2003 | Rozbicki | H01L 21/76805 438/597 |
| 6,627,542 B1 * | 9/2003 | Gandikota | H01L 21/76843 257/E21.585 |
| 6,642,146 B1 * | 11/2003 | Rozbicki | H01L 21/76805 438/622 |
| 6,740,585 B2 | 5/2004 | Yoon et al. | |
| 6,758,920 B2 | 7/2004 | Nagano et al. | |
| 6,800,494 B1 * | 10/2004 | Castle | H01L 21/76802 257/E21.525 |
| 6,881,673 B2 | 4/2005 | Ding et al. | |
| 6,909,637 B2 | 6/2005 | Nelson et al. | |
| 7,033,940 B1 | 4/2006 | Marathe et al. | |
| 7,341,945 B2 | 3/2008 | Yamamoto | |
| 7,352,048 B2 * | 4/2008 | Chung | C23C 14/046 257/210 |
| 7,396,755 B2 | 7/2008 | Haider | |
| 7,416,979 B2 | 8/2008 | Yoon et al. | |
| 7,452,812 B2 | 11/2008 | Beyer et al. | |
| 7,510,634 B1 | 3/2009 | Klawuhn et al. | |
| 7,645,696 B1 | 1/2010 | Dulkin et al. | |
| 7,659,197 B1 | 2/2010 | Juliano | |
| 7,682,966 B1 | 3/2010 | Rozbicki et al. | |
| 7,727,882 B1 * | 6/2010 | Wu | H01L 21/2855 257/E21.584 |
| 7,820,020 B2 | 10/2010 | Brown et al. | |
| 7,855,147 B1 * | 12/2010 | Dulkin | C23C 14/022 257/E21.161 |
| 8,062,484 B2 | 11/2011 | Brown et al. | |
| 8,668,816 B2 | 3/2014 | Ding et al. | |
| 8,791,018 B2 * | 7/2014 | Yu et al. | 438/687 |
| 9,051,641 B2 | 6/2015 | Lu et al. | |
| 2002/0092763 A1 * | 7/2002 | Denning | C23C 14/50 204/192.17 |
| 2003/0022480 A1 | 1/2003 | Tsai et al. | |
| 2003/0034244 A1 * | 2/2003 | Yasar | C23C 14/046 204/192.3 |
| 2003/0057526 A1 * | 3/2003 | Chung | H01L 21/2855 257/642 |
| 2003/0062333 A1 * | 4/2003 | Kranz | C23G 5/00 216/2 |
| 2004/0048461 A1 * | 3/2004 | Chen | C23C 14/022 438/629 |
| 2004/0266175 A1 | 12/2004 | Chen et al. | |
| 2006/0211243 A1 * | 9/2006 | Ishizaka | C23C 16/14 438/680 |
| 2006/0213439 A1 * | 9/2006 | Ishizaka | C23C 16/4401 118/715 |
| 2006/0258152 A1 | 11/2006 | Haider | |
| 2007/0039817 A1 | 2/2007 | Daniels et al. | |
| 2007/0224793 A1 * | 9/2007 | Cerio, Jr. | C23C 14/046 438/597 |
| 2007/0251818 A1 | 11/2007 | Yi et al. | |
| 2007/0281476 A1 * | 12/2007 | Lavoie | C23C 16/18 438/687 |
| 2008/0146028 A1 | 6/2008 | Yu et al. | |
| 2012/0043658 A1 * | 2/2012 | Collins | H01L 21/2855 257/751 |
| 2012/0115325 A1 * | 5/2012 | Park | H01L 21/28562 438/656 |

OTHER PUBLICATIONS

USPTO Final Rejection for U.S. Appl. No. 11/641,647 dated Jun. 7, 2011; 15 pages.

USPTO Final Rejection for U.S. Appl. No. 11/641,647 dated Jul. 25, 2013; 8 pages.

USPTO Final Rejection for U.S. Appl. No. 11/641,647 dated Sep. 14, 2010; 10 pages.

USPTO Final Rejection for U.S. Appl. No. 11/641,647 dated Dec. 9, 2009; 8 pages.

USPTO Non-Final Rejection for U.S. Appl. No. 11/641,647 dated Feb. 26, 2013; 9 pages.

USPTO NOn-Final Rejection for U.S. Appl. No. 11/641,647 dated May 24, 2010; 9 pages.

USPTO Non-Final Rejection for U.S. Appl. No. 11/641,647 dated Aug. 10, 2009; 6 pages.

USPTO Non-Final Rejection for U.S. Appl. No. 11/641,647 dated Sep. 27, 2013; 8 pages.

USPTO Non-Final Rejection for U.S. Appl. No. 11/641,647 dated Dec. 22, 2010; 10 pages.

USPTO Notice of Allowance for U.S. Appl. No. 11/641,647 dated Mar. 27, 2014; 9 pages.

U.S. Non-Final Rejection for U.S. Appl. No. 14/315,003 dated Jun. 10, 2016; 10 pages.

U.S. Advisory Action for U.S. Appl. No. 14/315,003 dated Feb. 2, 2017; 3 pages.

U.S. Final Rejection for U.S. Appl. No. 14/315,003 dated Nov. 22, 2016; 15 pages.

U.S. Non-Final Rejection for U.S. Appl. No. 14/315,003 dated Mar. 30, 2017; 16 pages.

* cited by examiner

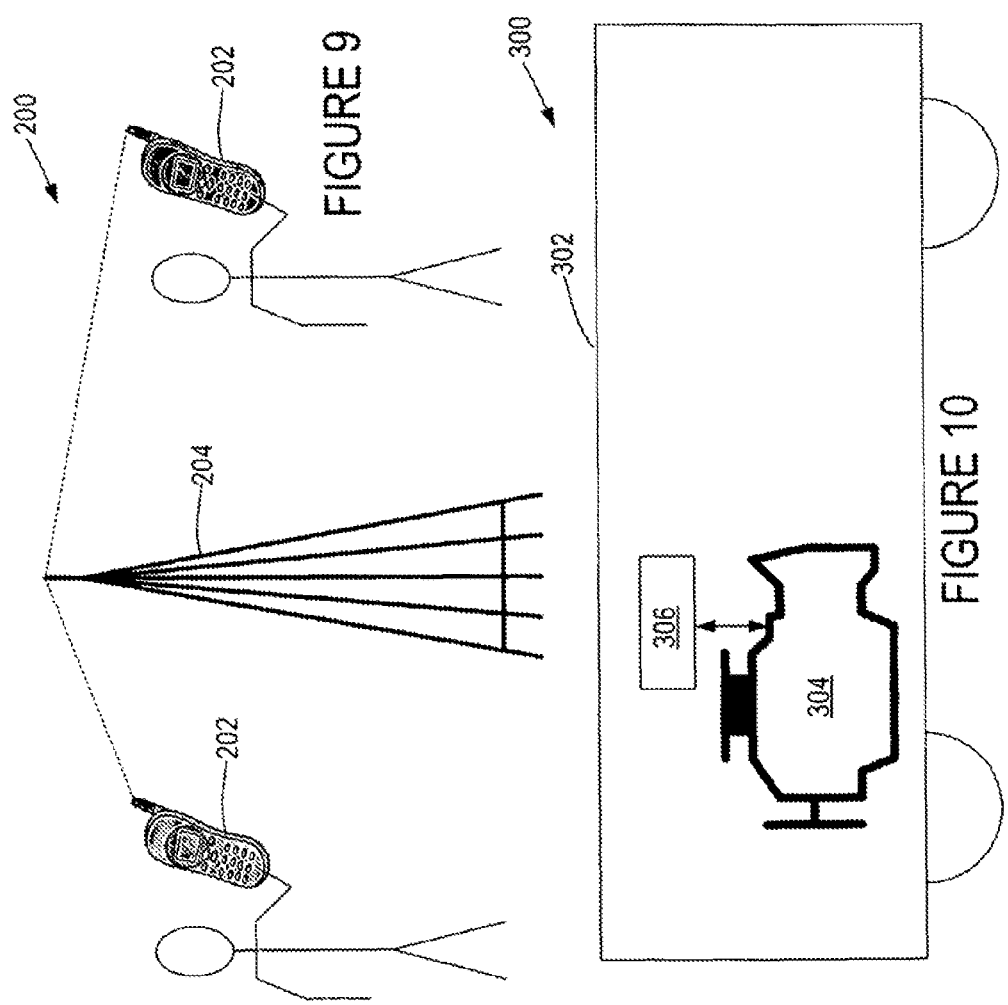

METHOD OF DEPOSITING COPPER USING PHYSICAL VAPOR DEPOSITION

RELATED APPLICATIONS

The present Application is a divisional of application Ser. No. 11/641,647, entitled "Method of Depositing Copper Using Physical Vapor Deposition" filed Dec. 19, 2006, which is all incorporated herein by reference.

BACKGROUND OF THE INVENTION

1. Technical Field

This invention relates generally to formation of layers on a semiconductor device, and more particularly, to formation of a thin copper layer.

2. Background Art

A common technique for forming device layers of various materials is PVD (Physical Vapor Deposition). With reference to FIGS. 1 and 2, the PVD process is a well-known magnetron sputtering process for depositing a layer on a substrate 20 supported on a platform 21. Typically (FIG. 1), a target 22 of the desired layer material is provided inside a vacuum chamber 24, and argon gas is introduced into the chamber 24 and is ionized to a positive charge (26). The target 22 is held at negative, while the wall of the chamber 24 is grounded, so that DC power is applied to add energy to the argon gas ions 26, causing the ions 26 to be accelerated toward the target 22. During the acceleration, the ions 26 gain momentum and strike the target 22. This causes atoms or molecules 28 of the target 22 to scatter in the chamber 24, with some being deposited on the substrate 20.

Formation of a thin (for example 20 angstroms thick), continuous copper layer on an oxide layer of a wafer using a copper target 29) has proven problematical. When using conventional PVD processes to form such a thin copper layer (containing only a small amount of copper) on an oxide such as $SiO_2$ 30, high surface tension causes the copper to form in large separate grains/crystals during the initial deposition, to minimize surface energy (so-called island growth). This island growth causes the deposited copper to agglomerate into distinct, separate copper globules 32 (FIG. 2) rather than a smooth, continuous, uniform layer as is desired.

What is needed is an approach wherein a smooth, continuous, uniform, thin copper layer may be formed.

DISCLOSURE OF THE INVENTION

Broadly stated, the present method of forming an electronic structure comprises providing a base layer and depositing a layer of copper by physical vapor deposition with the temperature of the base layer at 50.degree. C. or less, with the deposition taking place at a power level of 300 W or less.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 9-11 are systems incorporating devices formed using the present method.

BEST MODE(S) FOR CARRYING OUT THE INVENTION

Reference is now made in detail to a specific embodiment of the present invention which illustrates the best mode presently contemplated by the inventors for practicing the invention.

Figure 1:
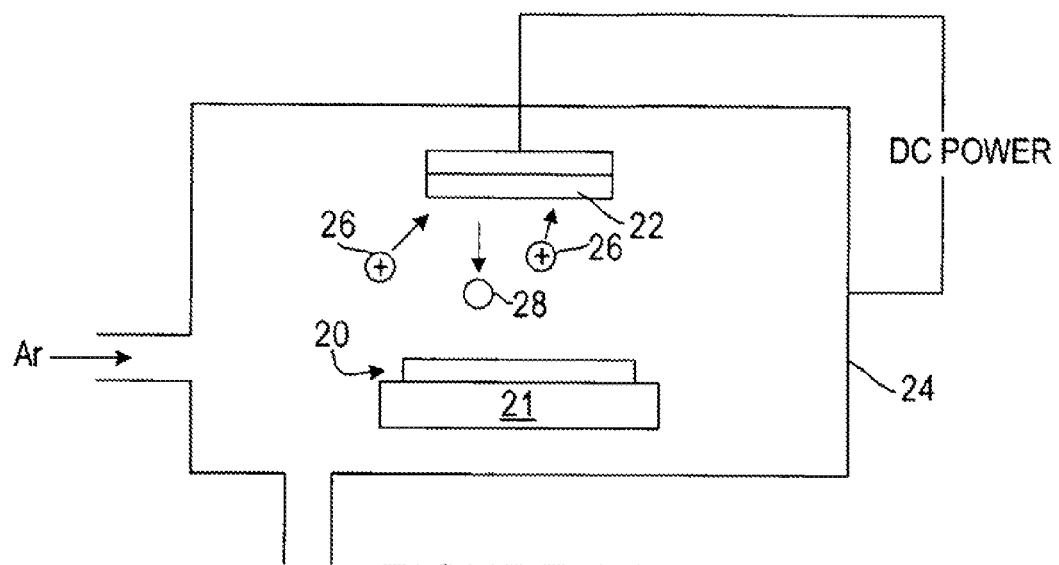
FIGS. 1 and 2 illustrate a typical prior approach in using PVD to deposit copper.
Figure 2:
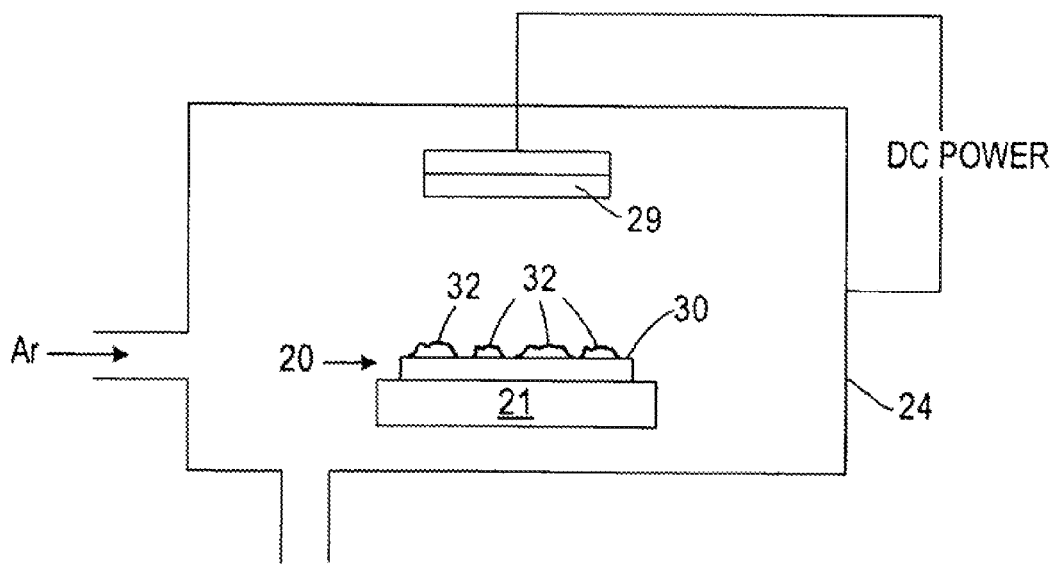
Figure 3:
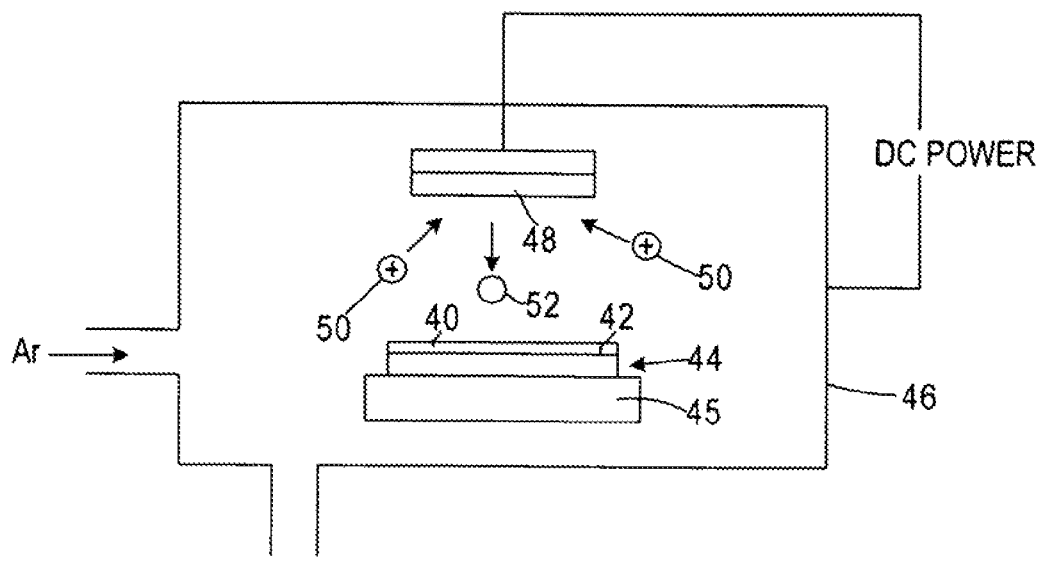
FIG. 3-8 illustrate the present approach in using PVD to deposit copper.

In the present approach, in forming an electronic structure, prior to the formation of a copper layer, a base layer of tantalum 40 is deposited on an oxide layer, for example an $SiO_2$ layer 42 of a wafer 44 on platform 45 (FIG. 3). This process is undertaken in a deposition chamber 46 (internal temperature approximately 30.degree. C.) using conventional DC magnetron PVD techniques. That is, a target 48 of tantalum is provided inside chamber 46, and argon gas is introduced into the chamber 46 and is ionized to a positive charge (50). The target 48 is held at negative, while the wall of the chamber 46 is grounded, so that DC power is applied to add energy to the argon gas ions 50, causing the ions 50 to be accelerated toward the target 48. During the acceleration, the ions 50 gain momentum and strike the target 48. This causes tantalum atoms 52 of the target 48 to scatter in the chamber 46, with some being deposited on the oxide layer 42 of the wafer 44 to form tantalum layer 40. The striking of the tantalum target material 48 with argon ions 50 causes the tantalum target material 48 to greatly increase in temperature, causing the temperature of the deposited tantalum layer 40 to be at a greatly elevated temperature (for example 200.degree. C.).

Figure 4:
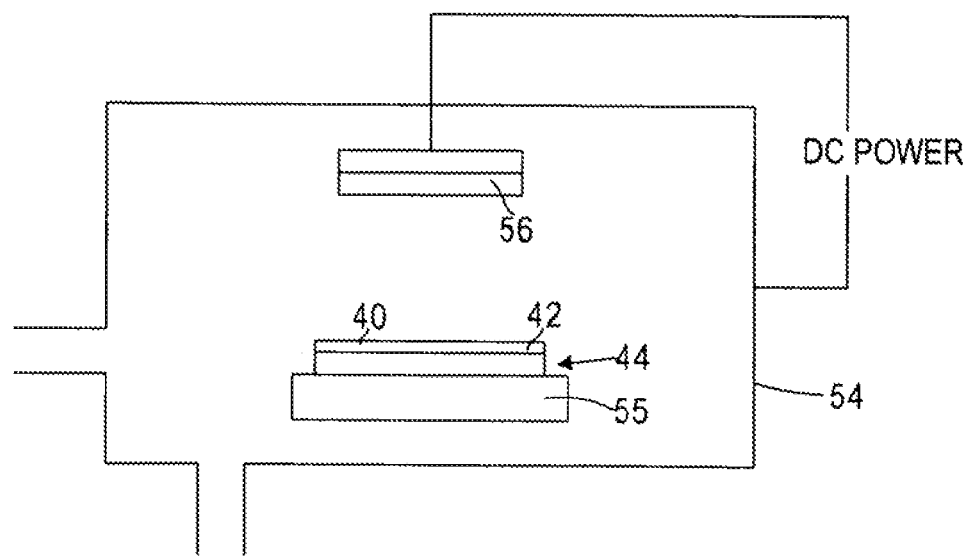

The resulting wafer 44 with tantalum 40 thereon, which is at the above described elevated temperature of approximately 200.degree. C., is immediately transferred to another DC magnetron sputtering chamber 54, so as to avoid contamination (FIG. 4), placed on platform 55 therein (internal temperature of chamber 54 approximately 30.degree. C.) for formation of a thin copper layer on the tantalum layer 40, by means of a copper target 56 as will be shown and described.

Figure 5:
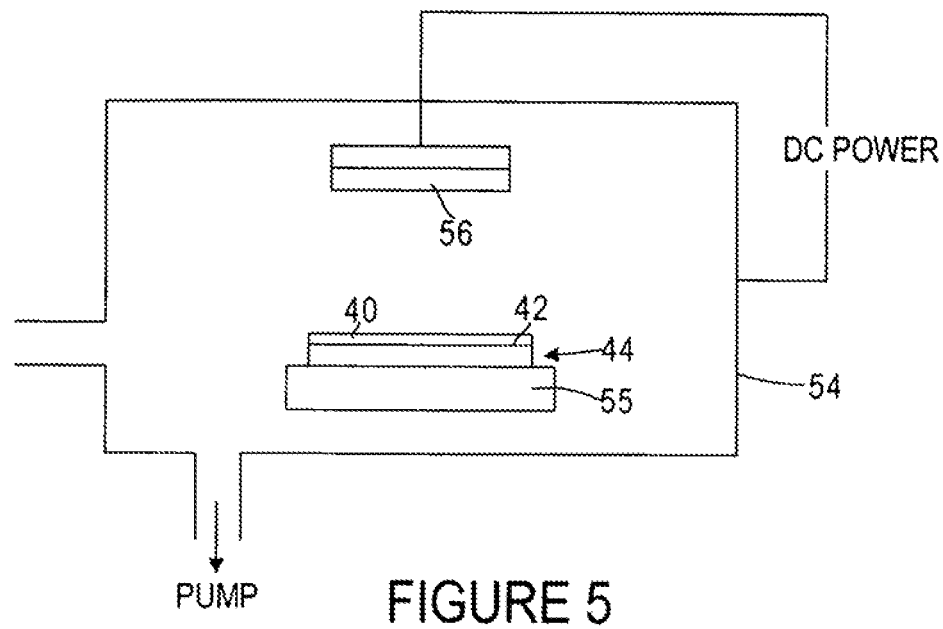

Immediately after the wafer 44 with tantalum layer 40 thereon enters the chamber 54, a pumpdown step is undertaken to provide a vacuum in the chamber 54 (FIG. 5). This step takes only a short time (in this example 3 seconds) and so the temperature of the tantalum layer 40 remains near 200.degree. C.

Figure 6:
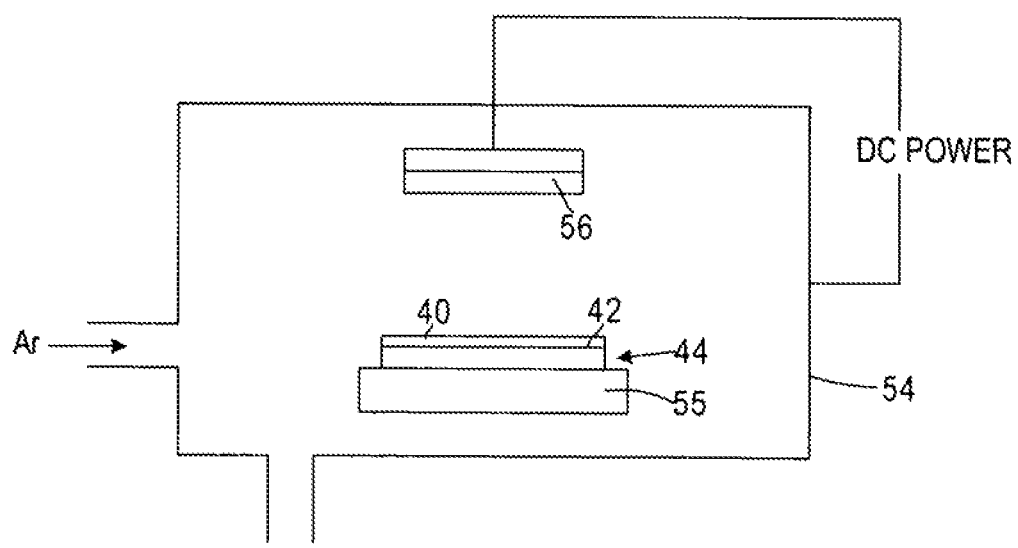

After this step is completed, a cooling step is undertaken, with argon gas flowing (FIG. 6), but without DC power. This step is undertaken for an extended period of time, in this embodiment 60 seconds, with argon gas flowing to the backside of the wafer 44 to effectively cool down the wafer 44 and tantalum layer 40. so that the tantalum layer 40 cools down to 50.degree. C. or less, preferably to approximately 30.degree. C., the internal temperature of the chamber 54.

Figure 7:
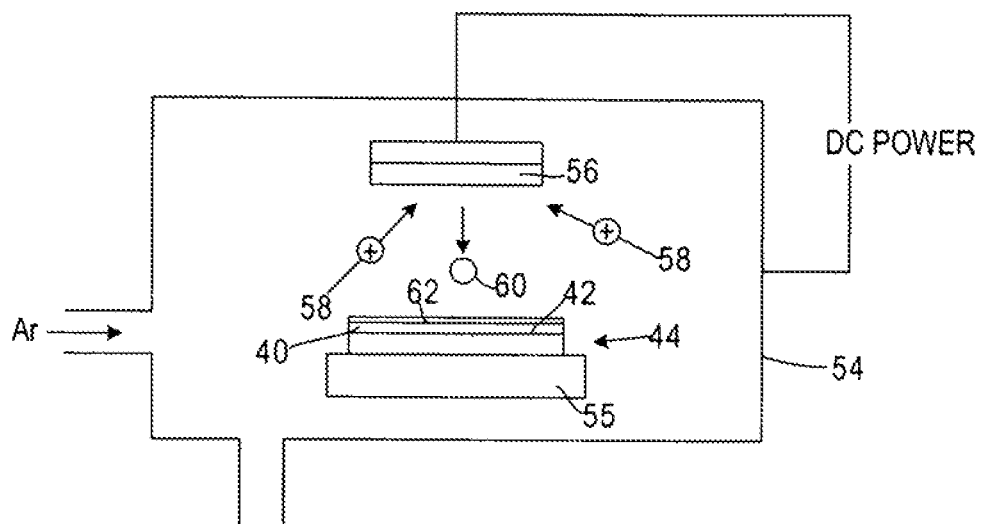

After this step is completed, a deposition step is undertaken (FIG. 7), with low DC power applied (300 w or less, in this embodiment 200 W). Argon gas continues to be introduced into the chamber 54 to establish a pressure of approximately 5 mTorr, and is ionized to a positive charge (58). The pressure and DC power level are carefully selected in order to obtain a stable plasma. The target 56 is held at negative, while the wall of the chamber 54 is grounded, so that DC power is applied to add energy to the argon gas ions 58, causing the ions 58 to be accelerated toward the target 56. During the acceleration, the ions 58 gain momentum and strike the copper target 56. This causes atoms 60 of copper to scatter in the chamber 54, with some being deposited on the tantalum layer 40. This deposition step is undertaken in this example for 10 seconds.

The tantalum layer 40 at low temperature promotes smooth copper nucleation across the surface of the tantalum layer 40, avoiding the island growth described above. In addition, the low temperature of the tantalum layer 40 along with low power applied during the deposition step (for example 200 W rather than for example 800 W or more as previously applied) promotes formation of a smooth, continuous, uniform, thin copper layer 62 (30 angstroms or less, in this embodiment approximately 20 angstroms) on the tantalum layer 40 by avoiding formation of globules thereof as described thereof.

Figure 8:
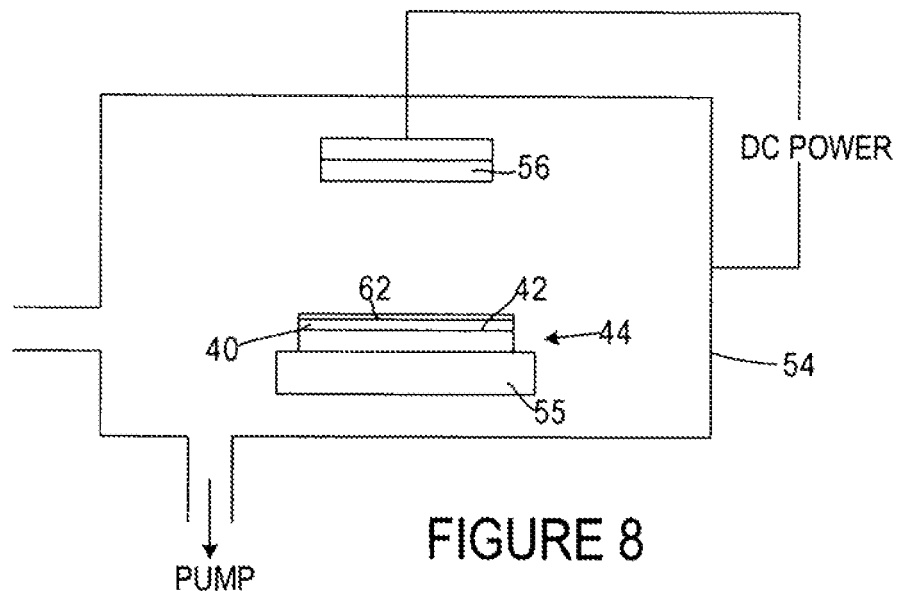

Finally, another pump-down step is undertaken (FIG. 8).

The present method succeeds in forming a thin, uniform smooth, continuous copper layer 62.

FIG. 9 illustrates a system 200 utilizing devices formed using the method described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses devices formed as shown and described. One skilled in the art will readily understand the advantage of using such devices in other hand-held devices which utilize data storage, such as portable media players, personal digital assistants, digital cameras and the like.

FIG. 10 illustrates another system 300 utilizing devices formed using the method described above. The system 300 includes a vehicle 302 having an engine 304 controlled by an electronic control unit 306. The electronic control unit 306 with advantage uses such devices.

Figure 11:
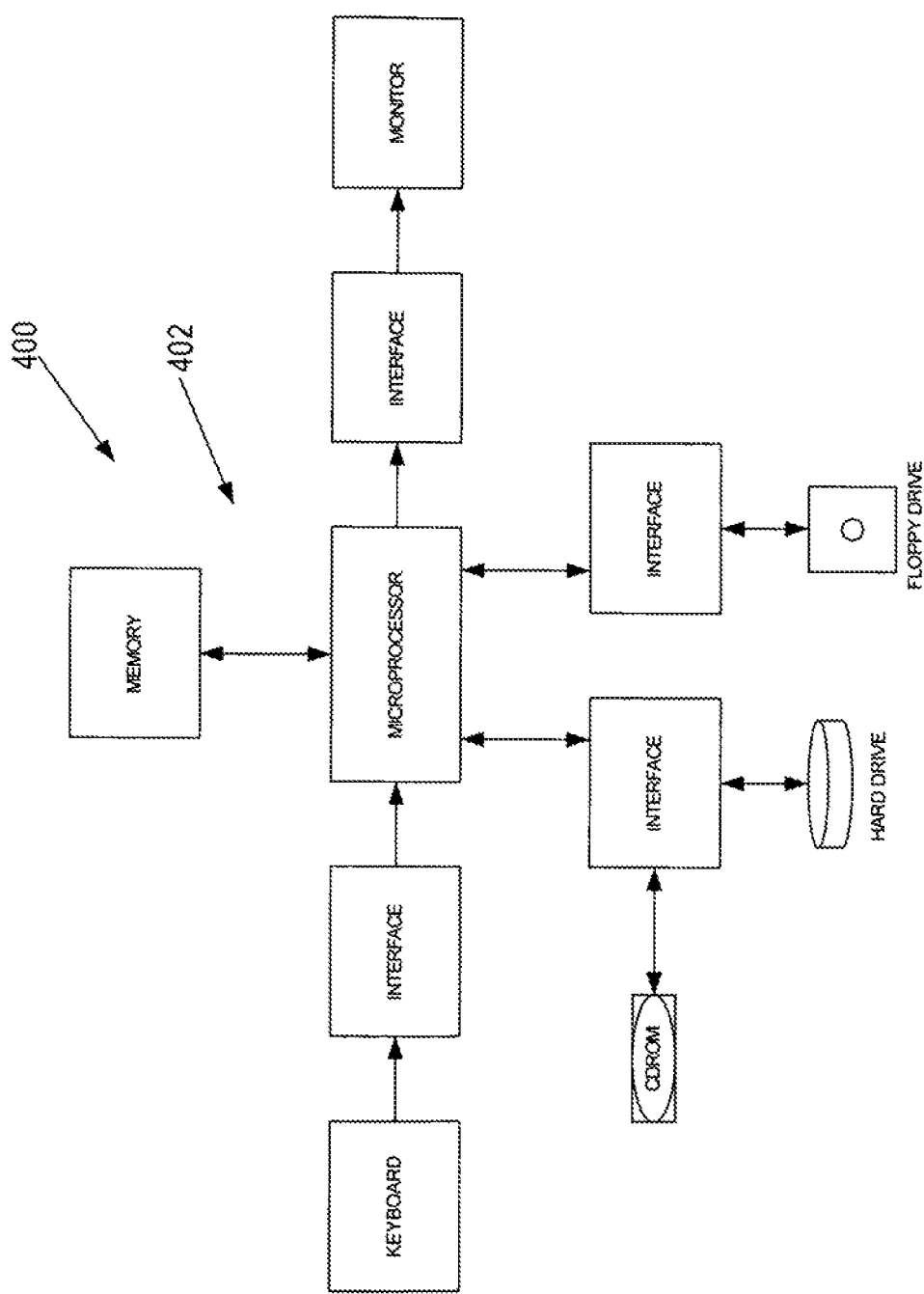

FIG. 11 illustrates yet another system 400 utilizing devices formed using the method described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The system with advantage uses such devices.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of forming an electronic structure, the method comprising:
   depositing, in a first sputtering chamber, a base layer onto an oxide layer, the base layer comprising tantalum, wherein the depositing results in a temperature of the base layer reaching a first temperature;
   transferring the base layer and the oxide layer from the first sputtering chamber to a second sputtering chamber to avoid contamination, wherein the transferring is performed prior to depositing copper onto the base layer, and wherein the second sputtering chamber is at a second temperature that is lower than the first temperature;
   providing a vacuum in the second sputtering chamber while the temperature of the base layer is closer to the first temperature than to the second temperature;
   cooling the base layer in the second chamber using a gas flow without applying DC power until the base layer reaches the second temperature of the second chamber; and
   subsequently applying the DC power at a power level of 300 W or less while maintaining the gas flow to deposit a layer of copper on the base layer by physical vapor deposition in the second chamber.

2. The method of claim 1, further comprising pumping down the second chamber to provide the vacuum.

3. The method of claim 2, wherein pumping down the second chamber takes a time of approximately 3 seconds.

4. The method of claim 1, wherein cooling the base layer further comprises cooling the oxide layer and the base layer.

5. The method of claim 4, wherein the cooling is performed for a period of approximately 60 seconds, and wherein the internal temperature of the second chamber is 50° C. or less.

6. The method of claim 1, wherein the layer of copper is deposited at a thickness of approximately 20 angstroms.

7. The method of claim 1, wherein said electronic structure is incorporated in a system.

8. The method of claim 7, wherein the system is a vehicle.

9. The method of claim 7, wherein the system is a hand-held device.

10. The method of claim 1, wherein a pressure and the power level are selected, for depositing the layer of copper, in order to obtain a stable plasma.

11. A method of forming an electronic structure, said method comprising:
    depositing, in a first sputtering chamber, a base layer on a layer of oxide that is formed on a surface of a wafer, the base layer comprising tantalum, wherein the depositing results in a temperature of the base layer reaching a first temperature;
    transferring the base layer and the oxide layer from the first sputtering chamber to a second sputtering chamber to avoid contamination, wherein the transferring is performed prior to depositing copper onto the base layer, and wherein the second sputtering chamber is at a second temperature that is lower than the first temperature;

providing a vacuum in the second sputtering chamber while the temperature of the base layer is closer to the first temperature than to the second temperature;

cooling the base layer in the second chamber using a gas flow without applying DC power until the base layer reaches the second temperature of the second chamber; and subsequently applying the DC power at a power level of 300 W or less while maintaining the gas flow to deposit a layer of copper on the base layer by physical vapor deposition in the second chamber.

12. The method of claim 11, further comprising pumping down the second chamber to provide the vacuum.

13. The method of claim 11, wherein the cooling further comprises cooling the layer of oxide.

14. The method of claim 11, wherein the layer of copper is deposited at a thickness of approximately 20 angstroms.

* * * * *